United States Patent [19]

Proebsting

[11] 4,412,314
[45] Oct. 25, 1983

[54] SEMICONDUCTOR MEMORY FOR USE IN CONJUNCTION WITH ERROR DETECTION AND CORRECTION CIRCUIT

[75] Inventor: Robert J. Proebsting, Dallas, Tex.
[73] Assignee: Mostek Corporation, Carrollton, Tex.
[21] Appl. No.: 292,122
[22] PCT Filed: Jun. 2, 1980
[86] PCT No.: PCT/US80/00672
§ 371 Date: Jun. 2, 1980
§ 102(e) Date: Jun. 2, 1980
[87] PCT Pub. No.: WO81/03568
PCT Pub. Date: Dec. 10, 1981
[51] Int. Cl.³ .............................................. G11C 7/00
[52] U.S. Cl. .................................. 365/222; 365/195; 365/200
[58] Field of Search ................ 365/195, 200, 201, 222

[56] References Cited

U.S. PATENT DOCUMENTS

| | | | |
|---|---|---|---|
| 3,719,932 | 3/1973 | Cappon | 365/222 |
| 3,969,706 | 7/1976 | Proebsting et al. | 340/173 R |
| 4,112,514 | 9/1978 | Spoelder | 365/222 |
| 4,183,096 | 1/1980 | Cenker et al. | 365/222 |

OTHER PUBLICATIONS

Harroun, "Storage Refresh Control and Synchronization", *IBM Tech. Disc. Bul.*, vol. 15, No. 1, 6/72, pp. 257-258.
Aichelmann et al., "Memory Initialization by Deferred Refresh", *IBM Tech. Disc. Bul.*, vol. 18, No. 5, 10/75, p. 1457.

Primary Examiner—Stuart N. Hecker

[57] ABSTRACT

A semiconductor dynamic memory circuit (10) includes a memory cell array (38) which includes a plurality of memory cells which are accessed through row and column lines by operation of row and column clock chain signals. A strap (68) is provided to operate the circuit (10) as either a memory which is refreshed according to internally generated addresses or a memory which is refreshed in response to externally supplied memory addresses and is easily incorporated into a memory system which utilizes error detection and correction during the refresh operation. In the absence of the strap (68) a refresh signal (20) refreshes cells of the array (38) in response to the address generated by an internal address counter (82). The circuit (10) accesses a given memory location when an externally supplied address is provided together with a RAS signal (12) and a CAS signal (16). When the strap (68) is incorporated into the circuit (10) the refresh signal (20) applied thereto causes the memory cell array (38) to be refreshed at the externally supplied address. The data within the memory cell array (38) is accessed in response to an externally supplied memory address, the RAS signal (12) and the CAS signal (16). The CAS signal (16) is inhibited in the absence of the RAS signal (12). The circuit (10) is used within a memory array (102) for reading out stored data together with error correcting bits while at the same time refreshing all of the memory circuits in the memory (102). An error detecting and correcting circuit (160) is provided to evaluate the data read out from the memory circuits and to provide a corrected data pattern when erroneous bits are detected.

4 Claims, 3 Drawing Figures

SEMICONDUCTOR MEMORY FOR USE IN CONJUNCTION WITH ERROR DETECTION AND CORRECTION CIRCUIT

TECHNICAL FIELD

The present invention pertains to integrated, semiconductor memories and in particular to such a memory adapted for use in conjunction with an error detecting and correcting circuit.

BACKGROUND ART

High density, semiconductor memories have become extensively used in computer systems as the cost of such memories has dropped. Semiconductor memories have largely replaced previously used magnetic core type memories. However, semiconductor memories are prone to single bit errors as a result of alpha particle radiation. When an alpha particle strikes the semiconductor material, electron-hole pairs are generated which can produce leakage currents that can discharge a node and change a data state. The electron-hole pairs can cause memory storage capacitors to be discharged. The bit lines in a dynamic memory are also susceptible to alpha particles. In all cases the alpha particles cause a loss of data even though no permanent damage is done to the circuit. The alpha particles are primarily derived from radioactive impurities used in the packaging of the semiconductor chip. Single bit errors such as caused by alpha particles are referred to soft errors and occur rather infrequently.

The semiconductor memories in computer systems are becoming quite large and in many cases data must be stored in the memories for an appreciable period of time, days, weeks and even longer. As the memories become larger and the storage time becomes longer, the probability of incurring soft errors due to alpha particle radiation increases. In many applications the accuracy of the data stored in the semiconductor memory is critical and the loss of a single bit within a field of data can produce a serious problem in the application being conducted by the computer.

There are techniques such as Hamming codes which can be used to detect errors but generally to detect only one error per data word. Since alpha errors occur intermittently there can occur two errors in the same word if the data pattern is corrected only when it is read out. Most existing systems generally perform error correction only when the data word is read out. Therefore it is possible that two errors can accumulate and the data word is lost.

Therefore, there exists a need for a semiconductor memory circuit and a memory system for detecting the occurrence of soft errors such as caused by alpha particles and correcting these errors on a recurring basis to prevent the accumulation of more errors in the data pattern stored in the semiconductor memory than can be handled by an error correction system.

DISCLOSURE OF THE INVENTION

The present invention is a dynamic, integrated, semiconductor memory circuit wherein a memory cell is accessed through row and column lines at a given memory address. The memory address is stored in an address buffer. The memory cell is accessed in response to the memory address and in response to a row address strobe (RAS) signal and a column address strobe (CAS) signal. The RAS signal generates row clock signals which access and refresh the memory cells on the row corresponding to the memory address in the address buffer. The CAS signal generates column clock signals for connecting the addressed memory cell to a data bus. The circuit of the present invention includes a terminal for receiving a refresh signal. Within the memory circuit row clock signals are generated upon receipt of the refresh signal as with receipt of the RAS signal. Logic circuitry is provided for inhibiting the generation of the column clock signals and/or the input/output circuitry in the absence of the RAS signal. The circuit further provides for transferring an externally supplied memory address to an address buffer when either the RAS signal or the refresh signal has been received at the circuit.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION OF THE INVENTION

Figure 1:
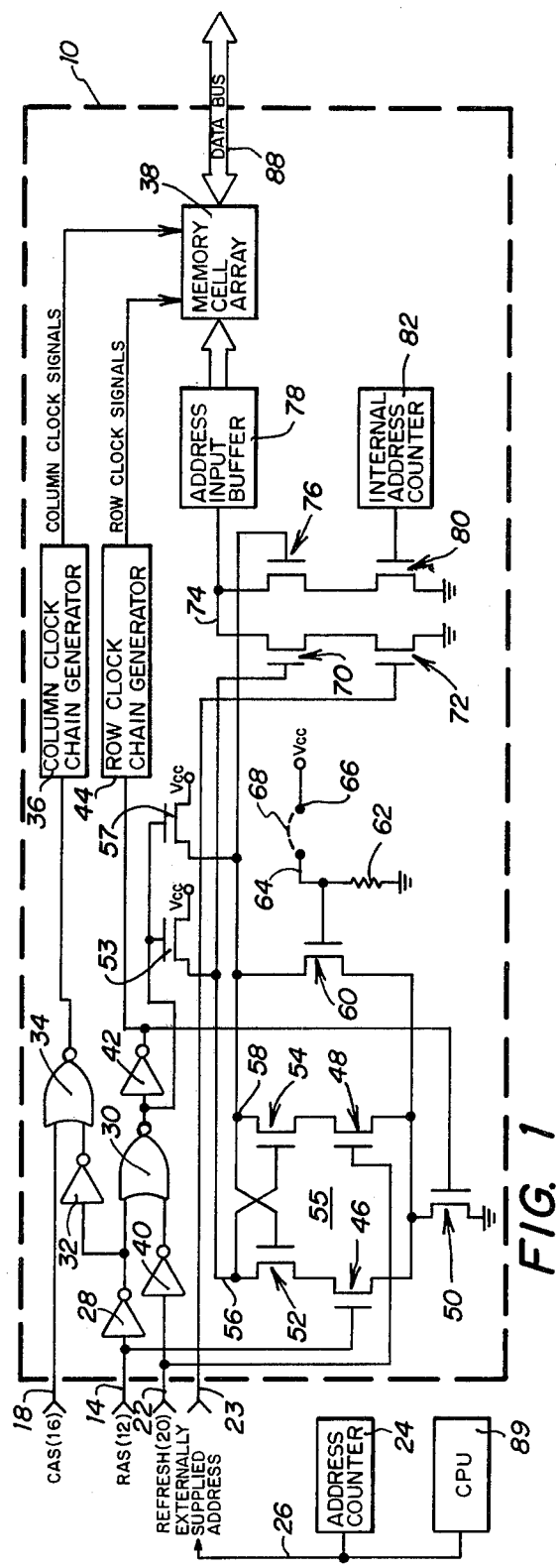
FIG. 1 is a schematic illustration of a dynamic semiconductor memory circuit in accordance with the present invention.

In the following descriptive material like reference numerals will be used in the various views to refer to like elements.

In large or high-precision computer applications, it is necessary that the integrity of the data patterns stored in the memory be maintained despite occasional malfunctions of components which store the data. As noted above, a data state can be altered in a semiconductor memory by alpha particle radiation while the data is stored in the memory. Error correcting codes have been devised which add redundant information to stored bit patterns such that when the pattern is read fron memory the presence of no more than a defined number of errors can be detected and corrected. A Hamming code can be used in this manner. An error correction code of this type, however, requires a substantial overhead in data storage, particularly in computer systems having short word lengths. But as the overall size of semiconductor memories increase and semiconductor memories are used in more critical applications, it becomes more important that the integrity of the data be maintained.

The error detecting and correcting Hamming code is described in the publication by R. W. Hamming entitled "Error Detecting and Correcting Codes" published in Bell Systems Technical Journal, Vol. 29, 1950, pp. 147-160.

In order to utilize an error correcting code which detects and corrects a single bit error, the data stored in the memory must be read out and examined and corrected at a frequency rate which substantially precludes the possibility of multiple errors occurring within a particular data word between examinations. Systems have heretofore been proposed wherein error correcting bits are stored along with the data and the data is error detected and corrected whenever it is read from memory. This type of system, however, leaves open the possibility that certain portions of the memory may not be read over extended periods of time thus leaving these portions vulnerable to the occurrence of multiple errors. It would be possible to read out the memory in sequence for error checking at a constant rate, but this would utilize a substantial portion of the memory time and seriously reduce the operating efficiency of the overall computer system.

Semiconductor memories can be particularly susceptible to alpha particle radiation which is generated by radioactive elements that are present as trace materials in connectors and packages for integrated circuits. This problem is discussed in "Hardening RAMS Against Soft Errors" by Bradsky, Mark published in Electronics, Vol. 53, No. 10, April 1980, pp. 117-122.

Dynamic memory circuits are frequently used in semiconductor memories and the memory cells used within these circuits require refreshing at periodic intervals on the order of several milliseconds. The portion of the memory time required for the refresh operation is essentially constant and is an accepted overhead penalty which must be paid for utilizing dynamic memories. The present invention provides a method and apparatus for carrying out the error correction function in a dynamic semiconductor memory in conjunction with the refresh operation so that the entire memory pattern is frequently examined for soft errors and such errors are corrected. By carrying out the error correction in connection with the refresh operation, very little overhead time is added due to the incorporation of error detection and correction.

Figure 2:
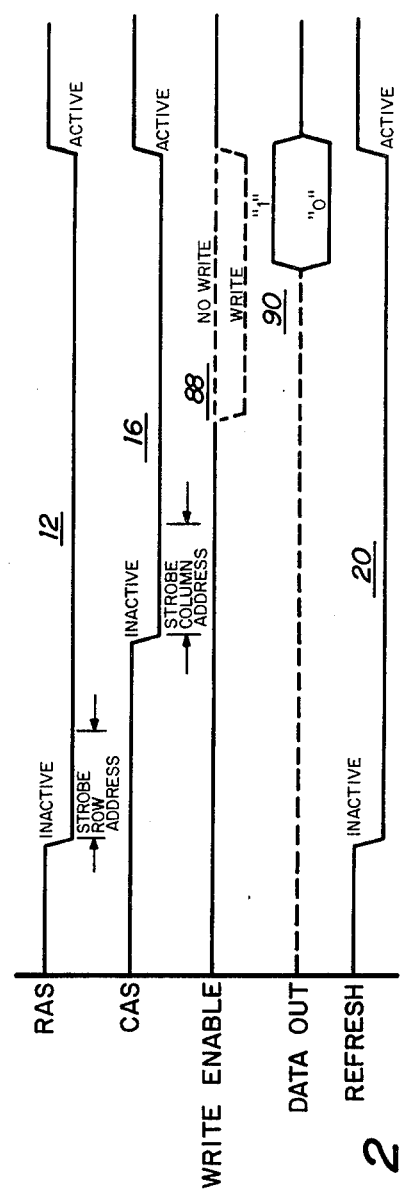
FIG. 2 is an illustration of various signal waveforms which are used in the circuits shown in FIG. 1.

Referring now to FIG. 1, a memory circuit 10 comprises an integrated semiconductor memory chip. Circuit 10 receives a number of control signals which are illustrated in FIG. 2. A RAS (Row Address Strobe) signal 12 is transmitted to circuit 10 through a terminal 14. A CAS (Column Address Strobe) signal 16 is transmitted through a terminal 18 to circuit 10. A refresh signal 20 is provided to circuit 10 through a terminal 22.

An external address counter 24 generates sequential memory addresses and transmits these addresses through a path 26 to a pin 23 of circuit 10. There is included a pin 23 for each of the bits of the address. Path 26 typically comprises multiple conductors which transfer addresses in parallel.

The RAS signal 12 is transmitted through line 14 to the input of an inverter 28. The output of inverter 28 is connected to the first input of a NOR gate 30 and to the input of an inverter 32. The CAS signal 16 is transmitted through line 18 to the first input of a NOR gate 34 while the output of inverter 32 is connected to the second input of NOR gate 34. The output of gate 34 is connected to drive a column clock chain generator circuit 36 which generates a group of column clock signals for operating the column access circuits, including input/output circuits, within a memory cell array 38. U.S. Pat. Nos. 3,902,082 and 3,969,706 illustrate the preferred circuitry for array 38.

The refresh signal 20 is transmitted through line 22 to the input of an inverter 40 which has the output thereof connected to the second input of the NOR gate 30. The output of gate 30 is connected to an inverter 42 which is in turn connected to drive a row clock chain generator circuit 44. The row clock chain generator 44 produces a group of row clock signals which control the operation and timing of the access transistors for the row lines within the memory cell array 38.

The RAS signal 12 is further transmitted to the gate terminal of a transistor 46. The refresh signal 20 is also transmitted to the gate terminal of a transistor 48. The source terminals of transistors 46 and 48 are connected to the drain terminal of a transistor 50 which has a source terminal thereof grounded. The gate terminal of transistor 50 is connected to the output of inverter 42.

The drain terminal of transistor 46 is connected to the source terminal of a transistor 52 and the drain terminal of transistor 48 is connected to the source terminal of a transistor 54. The drain terminal of transistor 52 is connected to a node 56 while the drain terminal of transistor 54 is connected to a node 58. The gate terminal of transistor 52 is connected to node 58 and the gate terminal of transistor 54 is connected to node 56.

A precharge transistor 53 has the source terminal thereof connected to node 56, the drain thereof connected to $V_{cc}$ and the gate terminal thereof connected to the output terminal of gate 30. A precharge transistor 57 has the source terminal thereof connected to node 58, the drain terminal thereof connected to $V_{cc}$ and the gate terminal connected to the output terminal of gate 30.

A CPU 89 is connected through line 26 to provide addresses for routine read or write operations.

The combination of transistors 46, 48, 52, 53, 54 and 57 functions as a differential amplifier 55 in which the inputs are the RAS signal 12 and the refresh signal 20 and the differential outputs are at nodes 56 and 58.

The node 58 is connected to the drain terminal of a transistor 60 which has a source terminal thereof connected to the drain terminal of transistor 50. The gate terminal of transistor 60 is connected to the first terminal of a resistor 62 which has a second terminal thereof connected to ground. The gate terminal of transistor 60 is further connected to a first terminal 64. A second terminal 66 is connected to the voltage source $V_{cc}$. A strap 68 is optionally installed to connect terminals 64 and 66. The optional functions related to strap 68 are described below.

Node 56 is connected to the gate terminal of a transistor 70 which has the source terminal thereof connected to the drain terminal of a transistor 72. The source terminal of transistor 72 is grounded. The gate terminal of transistor 72 is connected to line 23 for receiving an externally supplied address generated by the address counter 24 or CPU 89. The drain terminal of transistor 70 is connected to a node 74 which is in turn connected to the drain terminal of a transistor 76 and an address input buffer 78. The gate terminal of transistor 76 is connected to node 58. The source terminal of transistor 76 is connected to the drain terminal of a transistor 80 which has the source terminal thereof grounded. The gate terminal of transistor 80 is connected to an internal address counter 82, which generates sequential memory addresses for the memory locations in array 38. There is included in circuit 10 a set of the transistors 70, 72, 76 and 80 for each address pin 23 where there is a pin 23 for each bit of the address.

The address input buffer 78 transfers the memory addresses stored therein to the memory cell array 38 which includes decoders that receive the row and column portions of the memory address and utilize this address information to activate the appropriate rows and columns within the memory cell array. A data bus line 88 is connected to the memory cell array 38 for transferring data into and out of the memory cells.

Referring now to FIG. 2, the row address information is strobed into the memory cell array 38 when the RAS signal 12 transitions from the inactive to the active state (high level to low level). Similarly, the column address information is strobed into the memory cell array when the CAS signal 16 transitions from the inactive to the active state (high level to low level). A write enable signal 88 is activated to write into the selected memory cell. After the memory circuit 10 has been enabled, the data is read out of the memory at the time sequence indicated by data signal 90. The "one" and "zero" data states are defined arbitrarily for the particular system.

Operation of the memory circuit 10 is now described in reference to FIGS. 1 and 2. The memory circuit 10 is designed to function in either of two modes. When the strap 68 is not applied to connect terminal 64 to terminal 66, the circuit 10 is designed to operate as a dynamic memory which has an internal address counter for providing the address sequence for refresh operation. When the strap 68 is provided to connect terminal 64 to terminal 66, the circuit 10 functions in conjunction with external circuitry to provide an error detection and correction capability.

In the nonerror correcting embodiment of circuit 10 the refresh command operates in conjunction with the internally generated address to cause sequential rows of memory cells to be refreshed. The refresh operation for the dynamic memory cells included within circuit 10 is thus carried out by periodically driving to the active state the refresh signal 20.

In both configurations of circuit 10, errorcorrecting and internal sequential address generation, the read and write operations are accomplished as follows. The RAS signal 12 is driven to the active state in which a low level is applied to the input of inverter 28 which produces a high level at the output thereof. A high level applied to one input of the NOR gate 30 causes the output to be driven to a low level. The low level input to inverter 42 produces a high level output that activates the row clock chain generator 44 to produce the row clock signals which are applied to the memory cell array 38. The low level signal on the RAS input produces a high level at the input of inverter 32 driving the output of the inverter to a low level. If and when the CAS input 16 goes low, a high level is generated at the output of NOR gate 34 to initiate the sequence of column clocks. But when the refresh signal 20 goes active (low) and the RAS signal is high, the output of inverter 40 goes high causing the output of NOR gate 30 to go low. This in turn causes the output of inverter 42 to go high and initiate the row clock chain generator sequence with the RAS signal 12 remaining inactive (high). With refresh low and RAS high, the column clock chain is not enabled since a high RAS signal causes the output of inverter 28 to be low causing the output of inverter 32 to be high forcing the output of NOR gate 34 to remain low so that column clocks are not generated even if CAS goes active (low). If both RAS and refresh go low the row clock generator sequence is initiated by the first of the two to go low while the column clock chain generator is enabled only after RAS goes low and CAS goes low.

When strap 68 does not connect terminals 64 and 66, the gate terminal of transistor 60 is held low thereby turning transistor 60 off. In this case RAS going low (active) strobes in an externally supplied address while refresh going low strobes in an internally supplied address as described below. When the RAS signal goes low to initiate a cycle the external address received through pin 23 is processed by the address buffer 78. If the refresh signal goes low to initiate a cycle, the internal address counter 82 is processed by the address buffer 78. This function is described below.

The row address is transmitted through the external address input 23 and supplied to the address input buffers 78 and from the buffer to the memory cell array 38. This activates all of the memory cells along the row defined by the row address. After the row address is provided to the memory cell array 38 the CAS signal 16 transitions to the active state thus applying a low signal level to the first input of NOR gate 34. At this time the RAS signal 12 has driven the output of inverter 28 to a high level which is converted to a low level at the output of inverter 32. The low level signal applied from inverter 32 to the input of NOR gate 34 enables the CAS signal 16 to be transmitted to the output of NOR gate 34 as a high level signal to activate the column clock chain generator 36. The generator 36 produces the column clock signals for activating the column circuitry within the memory cell array 38. The column portion of the memory address is entered into the memory cell array 38 as indicated by the strobe in signal 16. After both the row and column address information has been supplied to the memory cell array 38 the appropriate memory location is accessed for data transfer through data bus 88.

The routing of the externally supplied address of pin 23 to the input address buffer 78 as described above occurs as follows. Where either the RAS signal 12 or the refresh signal 20 goes to the active state (low) the output of NOR gate 30 goes low turning off transistors 53 and 57 isolating nodes 56 and 58 permitting them to float at a high voltage. The low output of NOR gate 30 causes the output of inverter 42 to be driven to a high level thereby turning on transistor 50 and pulling the source terminals of transistors 46 and 48 to ground. When the RAS signal is in the low, active, state with the refresh signal 20 in the high state, transistor 48 is substantially more conductive than transistor 46. Since nodes 56 and 58 start at the same high potential transistors 52 and 54 both start out conductive. Thus, as transistor 50 brings the common source terminal of transistors 46 and 48 to ground, node 58 is discharged faster than node 56, turning off transistor 52. Node 58 is discharged to ground leaving node 56 at a high level. This leaves transistor 70 on and turns transistor 76 off.

The discharge of node 74 is independent of the internal address counter state since transistor 76 is turned off. If the input address at pin 23 is high, transistor 72 discharges node 74 through conductive transistor 70. If the input at node 23 is low, transistor 72 is off, so node 74 is not discharged. The data on node 74 is thus the complement of the address received at pin 23.

If the refresh signal 20 had gone active (low) while the RAS signal 14 had remained inactive (high), the differential amplifier 55 would have performed as described above except that node 56 is discharged to ground while node 58 remains high. In this case, transistor 70 would be turned off so that the externally supplied address has no effect on node 74 while transistor 76 remains on so that node 74 is discharged if the internal address counter has a high output at the gate of transistor 80.

The memory cells in the row selected by the internal address counter 82 within the memory cell array 38 are refreshed when the refresh signal 20 is applied to circuit 10. The memory cells in the row selected by the externally supplied address are refreshed when the RAS signal 12 is applied to circuit 10. As noted above when the refresh signal 20 goes to the active state the row clock chain generator 44 produces the row clock signals which activate the rows in array 38 addressed by the address in buffer 78. But whenever the RAS signal 12 is in the inactive state the CAS signal 18 cannot be transmitted to the column clock chain generator by operation of the inverters 28 and 32 and the NOR gate 34. When the refresh signal 20 is in the low state and the RAS signal 14 is in the high state the differential amplifier 55 drives node 56 to a low state and leaves node 58 in a high state. This causes transistor 70 to be turned off and transistor 76 to be turned on. When transistor 70 is turned off the external address pin 23 is isolated from the address input buffer 78. But when transistor 76 is turned on the internal address counter 82 is connected to the address input buffer 78.

When the refresh signal 20 alone is driven to the active state the address generated by the address counter 82 is supplied to the memory cell array 38. Counter 82 sequentially produces a new address following each time that it is used to supply an address to the memory cell array 38. Thus the periodic application of the refresh signal 20 to the refresh terminal causes all of the rows within the memory cell array 38 to be sequentially activated thereby restoring the data in the memory cells in the array.

In the second operational mode of circuit 10 the strap 68 is provided to interconnect terminals 64 and 68. This connection applies a high level to the gate terminal of transistor 60 to provide a low impedance path between node 58 and the drain terminal of transistor 50. As noted above when either the RAS signal 12 or the refresh signal 20 is driven to the active state the output of inverter 42 is driven to a high level. The high level from inverter 42 turns on transistor 50 which pulls the source terminals of transistors 46 and 48 to ground. As transistor 50 pulls down the common source terminal of transistors 46, 48 and 60, transistor 60 is conductive and is designed to have a very low impedance. This causes node 58 to be discharged through transistor 60 to the common source terminal of transistors 46, 48 and 60 nearly as fast as the common source terminal is discharged by transistor 50 to ground. If the voltage on node 58 never exceeds one transistor threshold voltage above that of the common source node, transistor 52 can never conduct. Thus, node 56 is guaranteed to remain in its initial high state while node 58 is guaranteed to go to ground independent of whether the RAS signal or the refresh signal initiated the cycle. Then with node 58 at ground, transistor 76 is guaranteed to be off so that the internal address counter output is ignored. With node 56 remaining high transistor 70 is guaranteed to be conductive so that the address input buffer responds to the externally supplied address. Therefore in this configuration, the internal address counter is permanently disabled from having any function and either a RAS or refresh command selects an externally supplied address.

In a memory system using a plurality of the circuits 10 in which the strap 68 between nodes 64 and 68 is not present, the RAS command is used for normal memory access cycles for writing or reading the memory in which the external address is supplied to the memory. For refresh purposes the refresh command is used to activate the memory with the internally generated address being selected. When a refresh command occurs in this case the internal counter in the memory circuits 10 being refreshed simultaneously are not synchronized with each other so each internal counter has a potentially different circuit address such that if the data for the internal address were read out of the memory, the data would be nonsense.

In order to carry out error correction in such a memory system during the refresh cycle it is necessary to have each of the circuits 10 process the same address so that the data word read out as bits from individual memory circuits represent parts of the same data word. To accomplish this an external address is supplied to cause the refreshing. To permit the circuit 10 to accept an external address for refresh purposes when the refresh command is activated, the strap from terminal 64 to terminal 68 is included in the circuit 10. With the strap the functionality of the differential amplifier 55 is modified so that independent of whether refresh or RAS is activated, in either case the internal address counter is disabled and the external address, supplied through pins 23, is transfered to the address input buffer 78.

In a large memory system all of the memory circuits 10 comprising the system must receive a refresh command each refresh cycle. However, only the circuits associated with a single given data word can be permitted to output data on the common bus line. In a normal memory cycle for reading or writing, a RAS command is only supplied to the circuits 10 associated with the word being accessed by the RAS decoder. In a similar manner the word to be error corrected will be selected in the bank of circuits 10 getting a RAS command since the circuits 10 which do not receive a RAS command do not output data, since inverter 32 disables NOR gate 34.

With the strap 68 in place the circuits 10 operate in the normal manner for routine memory access. The RAS signal 12 and the CAS signal 16 are applied together with an externally supplied address to access a given memory location and transfer data through the data bus 88. With the strap 68 connecting terminals 64 and 66 the circuit 10 is configured to permit simultaneous refreshing of the memory cells in array 39 and reading out of data for error detection and correction operations. The external address counter 24 generates sequential addresses for each of the memory locations within array 38. The least significant or fastest toggling addresses are used to select the row address to be refreshed. The combined refresh and readout occurs upon the application of the RAS signal 14, the CAS signal 18, the refresh signal 20 and an address supplied from the counter 24 through line 26 to pins 23. Upon application of these signals to the circuit 10 the row clock signals are produced by generator 44 and the column clock signals are produced by generator 36 for the memory circuits which receive a RAS signal. The address from counter 24 is transmitted to the input address buffer 78 and a location specified by the address is read from the array 38. In addition all of the memory cells along the addressed row are refreshed. In a complete memory system for a computer system a plurality of the circuits 10 will be utilized but only a small number of the circuits can be read out during each refresh cycle. The remainder of the memory cell locations must however be sequenced through the refresh operation in order to maintain the data within the cells. The remaining circuits 10 receive the refresh signal 20 and the CAS signal 16 but do not receive the RAS signal 12 which is supplied through a decoder to only a selected group of circuits 10. In the circuits which receive the refresh signal 20 the row clock signals are produced by the generator 44 and the externally supplied address from the counter 24 is transmitted to the address input buffer 78. The row clock signals cause the memory locations defined by the row portion of the address to be refreshed. However, the inverter 32 and NOR gate 34 are disabled and the CAS signal 16 cannot initiate the column clock chain generator 36. Thus the memory cell array is activated to refresh a given row of memory cells but no data is read from the memory cell array 38 because no column clock signals are provided to the array.

Figure 3:
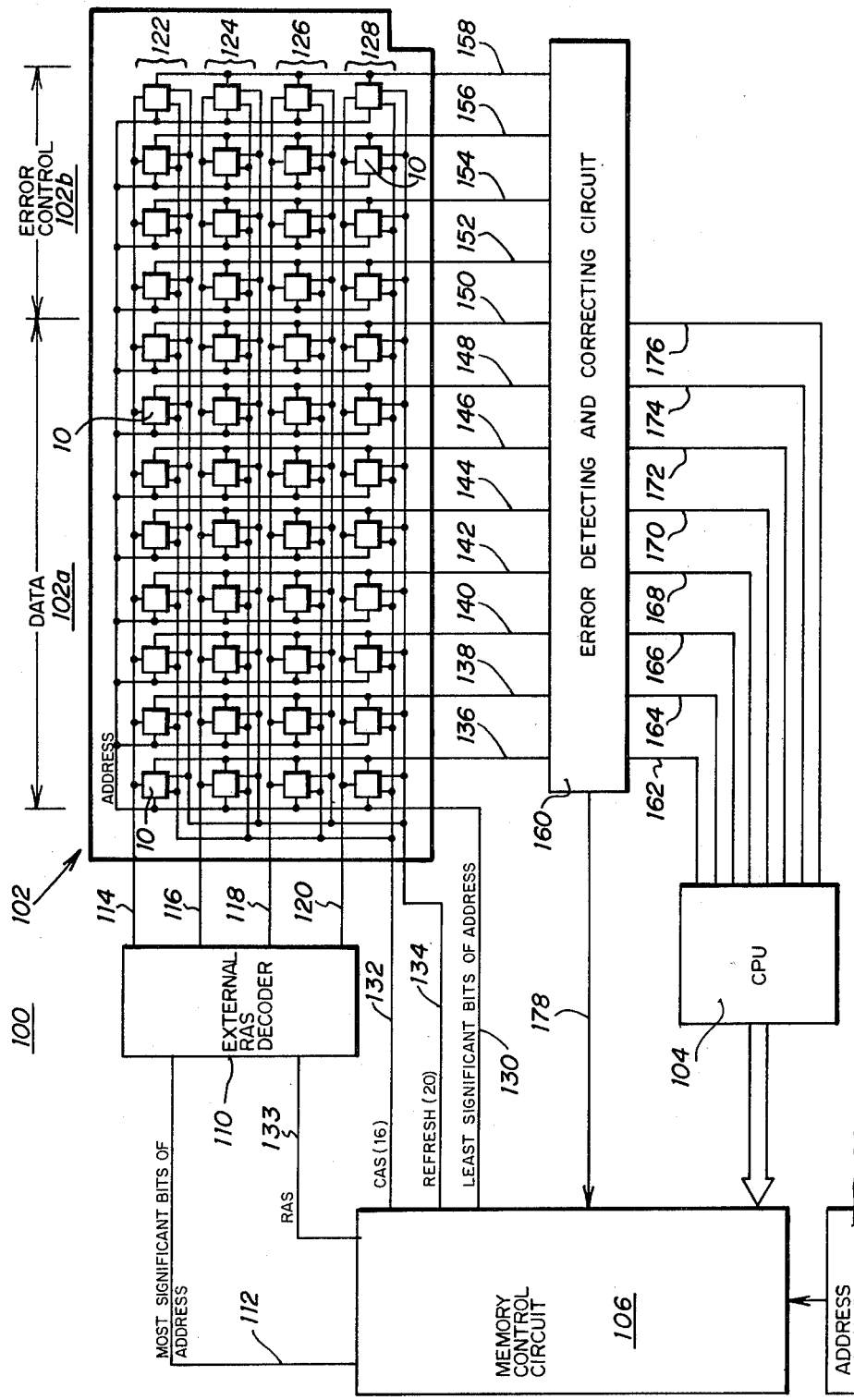
FIG. 3 is a semiconductor memory system which utilizes the memory circuit illustrated in FIG. 1 and operates in conjunction with an error detecting and correcting circuit to correct single bit errors while refreshing the dynamic memory cells.

The operation of circuit 10 in conjunction with a computer memory is further described below. Referring now to FIG. 3 there is shown a computer system 100 which incorporates a plurality of the circuits 10 to make up a computer memory array 102 which is a part of a complete memory system. In the embodiment illustrated in FIG. 3 the computer memory array 102 is made up of a four by twelve matrix of circuits 10. The memory array 102 is divided into a data portion 102a and an error control portion 102b. The memory array 102 is designed to have an eight bit data word and four error control bits as defined by the Hamming code referenced above.

The computer system 100 has a central processing unit 104 which is connected to a memory control circuit 106. A RAS signal is generated by memory control 106 and transmitted through a line 133 to an external RAS decoder 110. The RAS signal transmitted through line 133 is used to generate the RAS signal 12 which is supplied to the memory circuits 10. The memory control circuit 106 also transmits the most significant bits of the memory address through a line 112 through the RAS decoder 110. The most significant bits of the address are logically decoded by the RAS decoder 110 to produce a RAS signal on any one of the lines 114, 116, 118 and 120. The lines 114-120 are connected respectively to banks 122, 124, 126 and 128 of memory array 102. All of the RAS inputs for the circuits 10 within a given bank are connected in common to one of the output lines of RAS decoder 110.

The least significant bits of the memory addresses are transmitted from the memory control circuit 106 through a group of lines 130 to the input terminals of all of the circuits 10 within the memory array 102.

The memory control circuit 106 produces the CAS signal 16 and transmits it through line 132 to each of the memory circuits 10 within the memory array 102. The memory control circuit 106 also produces the refresh signal 20 which is transmitted through line 134 to each of the circuits 10 within the memory array 102.

The data outputs from the vertically stacked columns of circuits 10 are transmitted respectively through lines 136-158 to an error detecting and correcting circuit 160. The data from the memory array 102 is corrected as necessary by the circuit 160 and is transmitted to the CPU 104 through lines 162-176. The circuit 160 commands the memory control 106 through a line 178 to write a corrected data entry in the memory array 102.

A functional embodiment of the error detecting and correcting circuit 160 is described in the article by Wall, Ernest L. "Applying the Hamming Code to Microprocessor-Based Systems", Electronics, Vol. 52, No. 24, Nov. 22, 1979, pages 103-110.

The operation of the computer system 100 is now described in reference to FIG. 3. Each of the memory circuits 10 is configured to have the strap 68 connecting terminal 64 and 66 as shown in FIG. 1. This strapping establishes the circuits 10 for operation in conjunction with the error detecting and correcting circuit 160. The circuits 10 make it possible to have a very simple connecting arrangement for operation within the memory array 102. All of the CAS signal terminals 18 of the memory circuits 10 are connected in common to line 132. All of the refresh signal terminals 22 are connected in common to the line 134. The RAS terminals for the circuits 10 within each of the banks 122-128 are connected in common to the respective lines 114-120. The address ports for the least significant bits of the address are connected in common for all of the circuits 10 through the group of lines 130. Each of the columns of memory circuits 10 are connected to a common data path. It can be seen that the layout of memory array 102 is made very simple and straightforward by the design of the circuits 10.

The memory control circuit 106 periodically reads the address produced by counter 24 and generates the appropriate signals to refresh the memory cells within the memory array 102 and to read out a given word of memory for error detection and correction. The error detection and correction is thus carried out in conjunction with the refresh operation so that no additional overhead time is required to accommodate the error detection and correction. The most significant bits of the address are transmitted from the control circuit 106 to the external RAS decoder 110 which decodes these bits and selects one of the memory banks 122-128. The selected bank will have the addressed row refreshed and the addressed word read out for error detection and correction. The remaining banks of memory cells will only have the addressed rows refreshed.

During each cycle of refresh and error detection a data word is read out together with the four bits of error detection code. These twelve bits are received by the error detecting and correcting circuit 160 which processes the twelve bits to determine if one of the bits is erroneous. The erroneous bit is then corrected and the correct data word is transmitted from the circuit 160 back to the corresponding address in memory array 102. The memory control circuit 106 controls the memory array 102 to rewrite the corrected data word at the address which was accessed during the refresh cycle. The corrected data word including corrected error control bits is transferred from the circuit 160 through the data lines 136-158 back to the appropriate location in the memory array 102.

To refresh a dynamic memory circuit 10 it is necessary to select each of the rows at least once each refresh interval, typically two milliseconds. A normal read or write cycle accomplishes the refresh operation but is normally too specific in nature to guarantee to refresh every row of each circuit 10 at least every two milliseconds. To insure that the refresh requirement is carried out during each two millisecond interval special refresh cycles are generated. Each refresh cycle goes to all circuits 10 in the memory array 102 and one cycle is required for each row during each refresh interval. Therefore, if a circuit 10 has 128 ($2^7$) rows and requires refreshing of each row 512 ($2^9$) times per second, a total of $128 \times 512 = 65,536$ ($2^{16}$) refresh cycles are required each second. During these refresh cycles, 65,536 ($2^{16}$) words can be read and error corrected, if necessary. In a memory system containing one megabyte ($2^{20}$ words), each word will be error corrected each 16 ($2^4$) seconds.

To accomplish the refresh function it is necessary that during refresh the row addresses for the memory array 102 be sequenced from one memory refresh cycle to the next. Thus, the row addresses during refresh would be 0, 1, 2, ... 126, 127, 0, 1, 2, ... etc. The error correction during the very first cycle would be on the memory word located at row 0, column 0 and bank 122, followed by the word located at row 1, column 0, bank 122, followed in sequence by the rest of the rows through row 127, column 0, bank 122. These are followed similarly by rows 0-127 for column 1, bank 122. After all rows and columns of bank 122 have been error corrected banks 124, 126 and 128 are similarly error corrected.

A purpose of the present invention is to facilitate activting a given row of all circuits for a refresh cycle while enabling only one of the banks 122-128 for reading data for error correction purposes during this refresh cycle. This is accomplished in the present invention by providing the row and error correction address to the entire memory array 102 and applying the refresh command 20 to all circuits 10 within array 102. This carries out the refresh function. In addition, the external RAS decoder 110 applies a RAS signal to one of the four banks 122-128 and only that bank can output data or accept new error corrected data since the CAS command is inhibited in each of the banks not receiving the RAS command. Therefore the RAS decoder selects the bank for error correction so that it is not necessary to perform additional logic operations on the RAS, CAS or refresh commands to accomplish either refresh, error correction or both.

The present invention applies equally well to a memory circuit which does not have separate row and column strobe signals. Such circuits can have a single dedicated signal for strobing the entire address into the memory and a separate dedicated signal for strobing data out of the memory where the data strobe signal, by itself, does not enable data input or data output.

The circuit 160 would normally perform error detection and correction for each read cycle in the memory array 102 as well as during the refresh cycles. The advantage of error correcting during the refresh cycle is to guarantee that every word in the memory, whether being processed or not, is error corrected periodically to decrease the likelihood of multiple errors in the same word between error correction cycles.

Although several embodiments of the invention have been illustrated in the accompanying drawings and described in the foregoing Detailed Description, it will be understood that the invention is not limited to the embodiments disclosed, but is capable of numerous rearrangements, modifications, and substitutions without departing from the scope of the invention.

I claim:

1. In a semiconductor dynamic memory wherein a memory cell is accessed through row and column lines at a memory address in conjunction with a row address strobe (RAS) signal and a column address strobe (CAS) signal, the memory address stored in an address buffer, the RAS signal generating row clock signals which access and refresh the memory cells on the row corresponding to the memory address in the address buffer, the CAS signal generating column clock signals for connecting the addressed memory cell to a data bus, a circuit for enhancing the refresh of the memory cells and for enhancing error detection and correction, comprising:

a terminal for receiving a refresh signal;
an internal address counter for generating memory addresses;
means for optionally connecting first and second internal terminals;
means for generating said row clock signals upon receipt of said refresh signal;
means for inhibiting the generation of said column clock signals in the absence of said RAS signal; and
means for transferring the memory address in said address counter to said address buffer when said means for connecting is in the first state and said refresh signal is received in the absence of said RAS signal and for transferring an externally supplied memory address to said address buffer when said means for connecting is in a second state, and either said RAS signal or said refresh signal or said RAS signal and said refresh signal are received.

2. A semiconductor memory system which uses a plurality of memory circuits each having a plurality of memory cells that are accessed through row and column lines upon receipt of an externally supplied memory address in conjunction with a row address strobe (RAS) signal and a column address strobe (CAS) signal, the RAS signal generating row clock signals which access and refresh the memory cells on the row corresponding to the memory address, the CAS signal generating column clock signals for connecting the addressed memory cell to a data bus, said memory system comprising:

said memory circuits divided into blocks in which each block stores data bits for a data word and corresponding error control bits;
a refresh terminal for each of said memory circuits for receiving a refresh signal;
means integral with each of said memory circuits for generating said row clock signals in response to said refresh signal to refresh the memory cells on the row corresponding to said memory address;
means integral with each of said memory circuits for inhibiting the generation of said column clock signals in the absence of receipt of said RAS signal;
an error detecting and correcting circuit connected to said data buses for receiving said data bits and corresponding error correction bits and for detecting and correcting no more than a predetermined number of erroneous bits therein;
means for generating said memory addresses;
means for transmitting a first group of said memory address bits to each of said memory circuits;
a RAS decoder circuit connected to receive and decode a second group of said memory address bits and for generating a block RAS signal for each of said blocks of memory circuits;
a block RAS node for each of said memory blocks for transmitting said block RAS signals to each of the memory circuits in the corresponding memory blocks;
a CAS node for transmitting said CAS signal to each of the memory circuits in said memory system; and
a refresh node for transmitting said refresh signal to each of the memory circuits in said memory system.

3. A method for reading the data pattern stored in a semiconductor dynamic memory circuit in conjunction with the refresh operation for the memory circuit wherein memory cells are accessed through row and column lines upon receipt of an externally supplied memory address in conjunction with a row address strobe (RAS) signal and a column address strobe (CAS) signal, the RAS signal generating row clock signals which access and refresh the memory cells on the row corresponding to the address, the CAS signal generating column clock signals for connecting the addressed memory cell to a data bus, the method comprising the steps of:

transmitting a refresh signal to a refresh terminal of said memory circuit for generating said row clock signals to refresh the memory cells on the row corresponding to said memory address, inhibiting the generation of said column clock signals in the absence of said RAS signal, and reading out the data stored at said memory address upon receipt of said RAS signal and said CAS signal.

4. A method for correcting data in a semiconductor dynamic memory system which uses a plurality of memory circuits each having a plurality of memory cells that are accessed through row and column lines upon receipt of an externally supplied memory address in conjunction with a row address strobe (RAS) signal and a column address strobe (CAS) signal, the RAS signal generating row clock signals which access and refresh the memory cells on the row corresponding to the memory address, the CAS signal generating column clock signals for connecting the addressed memory cell to a data bus, comprising the steps of:

collecting the memory circuits into banks wherein each bank stores data bits for a data word and corresponding error control bits;

providing a refresh signal on a recurring basis through a system refresh node to each of the memory circuits for generating said row clock signals to refresh the memory cells on the row corresponding to the memory address received at the memory circuit;

inhibiting the generation of said column clock signals within each of said memory circuits in the absence of receipt of said RAS signal at the memory circuit;

generating sequential memory addresses;

decoding a first group of bits of said sequential memory address and generating therefrom said RAS signal for one of said memory banks;

transmitting a second group of bits of said sequential memory address to each of said memory circuits to serve as the memory address therein;

transmitting said RAS signal on a recurring basis to each of the memory circuits in the corresponding memory bank;

transmitting said CAS signal on a recurring basis through a system CAS node to each of the memory circuits in said memory system;

transmitting said refresh signal on a recurring basis through a refresh node to each of the memory circuits in said memory system;

reading out data bits and error correction bits from the memory circuits in the memory bank which receives the RAS signal in addition to the refresh signal;

evaluating the data bits and error correction bits read out from said memory bank to detect and correct any bit errors therein; and transmitting a corrected data bit and error correction bit pattern to the memory locations in said memory system from which an erroneous bit pattern has been read out.

* * * * *